(12) United States Patent
Woytowitz et al.

(10) Patent No.: US 10,832,936 B2
(45) Date of Patent: Nov. 10, 2020

(54) SUBSTRATE SUPPORT WITH INCREASING AREAL DENSITY AND CORRESPONDING METHOD OF FABRICATING

(71) Applicant: Lam Research Corporation, Fremont, CA (US)

(72) Inventors: Peter Woytowitz, Los Altos, CA (US); Vincent Burkhart, Cupertino, CA (US); Michael Rumer, Santa Clara, CA (US); Karl Leeser, West Linn, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 693 days.

(21) Appl. No.: 15/220,926

(22) Filed: Jul. 27, 2016

(65) Prior Publication Data
US 2018/0033672 A1    Feb. 1, 2018

(51) Int. Cl.
| | |
|---|---|
| *C23C 16/458* | (2006.01) |
| *C23C 16/505* | (2006.01) |
| *H01L 21/687* | (2006.01) |
| *H01L 21/683* | (2006.01) |
| *H01J 37/32* | (2006.01) |

(52) U.S. Cl.
CPC ...... *H01L 21/68735* (2013.01); *C23C 16/458* (2013.01); *C23C 16/4581* (2013.01); *C23C 16/4583* (2013.01); *C23C 16/505* (2013.01); *H01J 37/32082* (2013.01); *H01J 37/32715* (2013.01); *H01L 21/6833* (2013.01); *H01L 21/6875* (2013.01); *H01J 2237/334* (2013.01); *H01J 2237/3321* (2013.01)

(58) Field of Classification Search
CPC ............. C23C 16/458; C23C 16/4581; C23C 16/4583; C23C 16/505; H01L 21/6875; H01L 21/68735; H01L 21/6833; H01L 21/67366; H01J 37/32715; H01J 37/32082
See application file for complete search history.

(56) References Cited

U.S. PATENT DOCUMENTS

| | | | | |
|---|---|---|---|---|
| 5,531,835 A * | 7/1996 | Fodor | .................. | H01L 21/6831 118/728 |
| 5,548,470 A * | 8/1996 | Husain | ................ | H01L 21/6833 361/234 |
| 5,745,332 A * | 4/1998 | Burkhart | ............. | H01L 21/6833 361/234 |
| 5,986,874 A * | 11/1999 | Ross | ................... | H01L 21/6831 279/128 |
| 6,320,736 B1 * | 11/2001 | Shamouilian | ....... | C23C 16/4586 361/115 |
| 6,768,627 B1 * | 7/2004 | Kitabayashi | ............. | B23Q 3/15 361/234 |

(Continued)

FOREIGN PATENT DOCUMENTS

WO    WO-2015077590 A1    5/2015

*Primary Examiner* — Aiden Lee

(57) ABSTRACT

A substrate support for a substrate processing system is provided and includes a body and mesas. The mesas are distributed across and extending from and in a direction away from the body. The mesas are configured to support a substrate. Each of the mesas includes a surface area that contacts and supports the substrate. Areal density of the mesas monotonically increases as a radial distance from a center of the substrate support increases.

17 Claims, 7 Drawing Sheets

(56) References Cited

U.S. PATENT DOCUMENTS

| | | | |
|---|---|---|---|
| 6,917,755 B2 * | 7/2005 | Nguyen | C23C 16/4581 |
| | | | 118/50.1 |
| 6,955,748 B2 | 10/2005 | Kim | |
| 7,511,935 B2 | 3/2009 | Nakash | |
| 2005/0276928 A1 * | 12/2005 | Okumura | H01J 37/32009 |
| | | | 427/446 |
| 2006/0021705 A1 * | 2/2006 | Imai | C23C 16/4581 |
| | | | 156/345.52 |
| 2007/0217114 A1 * | 9/2007 | Sasaki | H01L 21/6875 |
| | | | 361/145 |
| 2009/0284894 A1 * | 11/2009 | Cooke | H01L 21/6875 |
| | | | 361/234 |
| 2010/0159712 A1 | 6/2010 | Steger | |
| 2014/0238609 A1 * | 8/2014 | Tomioka | H01L 21/6875 |
| | | | 156/345.53 |
| 2015/0146339 A1 | 5/2015 | Raj et al. | |

* cited by examiner

൬US 10,832,936 B2൬

SUBSTRATE SUPPORT WITH INCREASING AREAL DENSITY AND CORRESPONDING METHOD OF FABRICATING

FIELD

The present disclosure relates to substrate supports of substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, a plasma enhanced chemical vapor deposition (PECVD) process, a physical vapor deposition (PVD) process, an ion implantation process, and/or other etch, deposition, and cleaning processes. A substrate may be arranged on a substrate support such as a pedestal, an electrostatic chuck (ESC), etc. in a processing chamber of the substrate processing system. For example, during etching in a PECVD process, a gas mixture including one or more precursors is introduced into the processing chamber and plasma is struck to etch the substrate.

SUMMARY

A substrate support for a substrate processing system is provided and includes a body and mesas. The mesas are distributed across and extending from and in a direction away from the body. The mesas are configured to support a substrate. Each of the mesas includes a surface area that contacts and supports the substrate. Areal density of the mesas monotonically increases as a radial distance from a center of the substrate support increases.

In other features, a method is provided and includes: estimating an amount of thermal expansion of a substrate; estimating an applied pressure on the substrate over one or more mesas of a substrate support; and estimating areal densities of the mesas across the substrate support, such that the areal densities monotonically increase as a radial distance of the substrate support increases. The method further includes: estimating a wear depth of the substrate due to rubbing between the substrate and the mesas, where the wear depth is estimated based on the amount of thermal expansion, the applied pressure, and the areal densities; and adjusting one or more parameters based on the wear depth to minimize the wear depth.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Traditionally, contact area between a substrate and a substrate support is distributed uniformly across a surface of the substrate. This uniformly distributed contact area arrangement is appropriate for applications when a substrate support is not substantially heated during substrate processing. However, for applications that include substantial heating of a substrate, use of a substrate support that has a uniformly distributed contact area relative to a substrate can result in backside wear. Backside wear refers to scratching on a backside of the substrate. The backside of the substrate refers to the side of the substrate that is in contact with the substrate support. During processing, thermal expansion and contraction of the substrate causes the substrate to rub on the substrate support resulting in scratches on the backside of the substrate.

The amount of expansion and contraction of the substrate increases with a radius of the substrate, such that there is minimal to no expansion and contraction at the center of the substrate and a maximum amount of expansion and contraction at the outer circumferential edge of the substrate. As a result, the amount of scratches that can occur on a backside of the substrate increases with radius, such that a least amount of scratches exist near a center of the substrate and a greatest amount of scratches exist near an outer circumferential edge of the substrate. The surface-to-surface rubbing between the substrate and substrate support results in particles being scratched off the backside of the substrate. This can cause defects on the substrate and/or other substrates within a processing chamber.

Apparatuses and methods described below include substrate supports designed to minimize scratching of the backside of substrates. Improved contact between a substrate and a substrate support is provided to uniformly distribute forces exerted on the substrate during substrate processing when temperatures of the substrate support can vary. Uniform distribution of the forces exerted during substrate processing minimizes backside wear.

Figure 1:
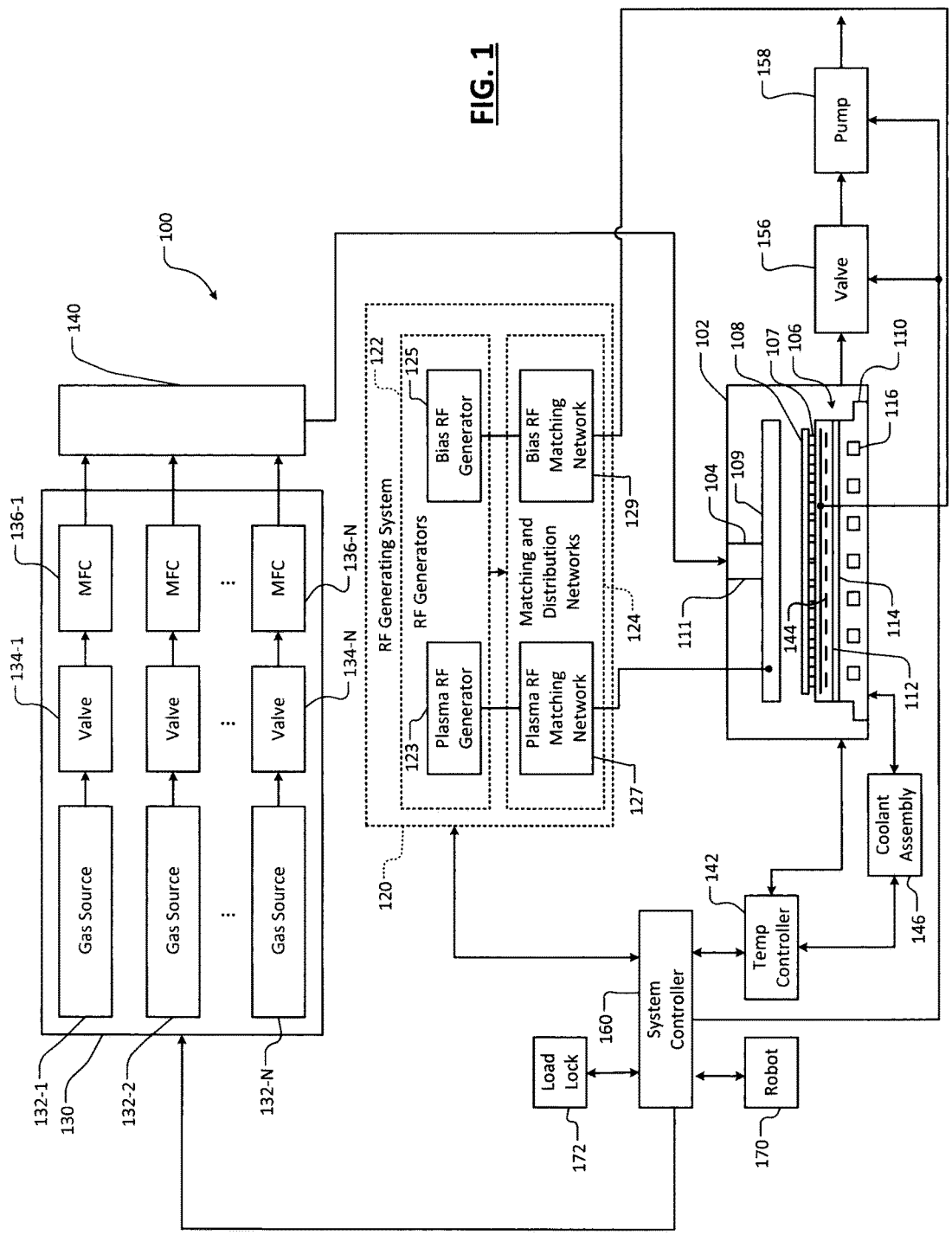
FIG. 1 is a functional block diagram of an example of a substrate processing system incorporating a substrate support in accordance with an embodiment of the present disclosure.

FIG. 1 shows an example substrate processing system 100 for performing processing using RF plasma. Although FIG. 1 shows a capacitive coupled plasma (CCP) system, the embodiments disclosed herein are applicable to transformer coupled plasma (TCP) systems, electron cyclotron resonance (ECR) plasma systems, inductively coupled plasma (ICP) systems and/or other systems and plasma sources that include a substrate support. The embodiments are applicable to physical vapor deposition (PVD) processes, plasma enhanced chemical vapor deposition (PECVD) processes, chemically enhanced plasma vapor deposition (CEPVD) processes, ion implantation processes, and/or other etch, deposition, and cleaning processes.

The substrate processing system 100 includes a processing chamber 102. The processing chamber 102 encloses other components of the processing chamber 102 and contains the RF plasma. The processing chamber 102 includes an upper electrode 104 and a substrate support 106 (e.g., an ESC). During operation, a substrate 108 is arranged on a substrate support 106. The substrate support 106 includes minimum contact area (MCA) features 107. Each of the MCA features 107 may be referred to as a "mesa". The mesas 107 are distributed across a top portion (or portion nearest the substrate 108) of the substrate support 106, extend upwards away from the substrate support, and support the substrate 108. The mesas 107 are in contact with the substrate 108. The substrate 108 may be electrostatically clamped onto the substrate support 106. The mesas 107 may be integrally formed as part of a top metallic layer of the substrate support 106. The substrate support 106 may include any number of mesas.

As further described below, contact surface area of the mesas 107 relative to the substrate 108 increases with radius of the substrate support 106 (or distance away from a center of the substrate support 106) and thus with radius of the substrate 108 (or distance away from a center of the substrate 108). This is because the substrate 108 is centered on the substrate support. The diameter, surface area, size and/or quantity of the mesas may increase per unit area of a top lateral surface of the substrate support 106 as a radial distance from a center of the substrate support 106 increases. The mesas 107 may be cylindrically-shaped as shown in FIGS. 2-3 and 4-5 and/or may be shaped differently (e.g., hemi-spherically-shaped or semi-spherically-shaped). Structure and formation of the mesas are further described below with respect to FIGS. 2-6.

For example only, the upper electrode 104 may include a showerhead 109 that introduces and distributes gases. The showerhead 109 may include a stem portion 111 including one end connected to a top surface of the processing chamber 102. The showerhead 109 is generally cylindrical and extends radially outward from an opposite end of the stem portion 111 at a location that is spaced from the top surface of the processing chamber 102. A substrate-facing surface of the showerhead 109 includes holes through which process or purge gas flows. Alternately, the upper electrode 104 may include a conducting plate and the gases may be introduced in another manner.

The substrate support 106 includes a conductive baseplate 110 that acts as a lower electrode. The baseplate 110 supports a heating plate 112, which may be formed at least partially of a ceramic material. A thermal resistance layer 114 may be arranged between the heating plate 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or at a floating potential. For example only, the RF generating system 120 may include one or more RF generators 122 (e.g., a capacitive coupled plasma RF power generator, a bias RF power generator, and/or other RF power generator) that generate RF voltages, which are fed by one or more matching and distribution networks 124 to the upper electrode 104 and/or the baseplate 110. As an example, a plasma RF generator 123, a bias RF generator 125, a plasma RF matching network 127 and a bias RF matching network 129 are shown.

A gas delivery system 130 includes one or more gas sources 132-1, 132-2, . . . , and 132-N (collectively gas sources 132), where N is an integer greater than zero. The gas sources 132 supply one or more precursors and mixtures thereof. The gas sources 132 may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to TCEs 144 (sometimes referred to as actuators) arranged in the heating plate 112. Although shown separately from a system controller 160, the temperature controller 142 may be implemented as part of the system controller 160. As an example, the TCEs 144 may include, but are not limited to, respective macro TCEs (or first array of TCEs) corresponding to each macro zone of the heating plate 112 and/or micro TCEs (or second array of TCEs) corresponding to each micro zone of the heating plate 112. The macro TCEs may be used for coarse tuning temperatures and/or other fields of macro zones of the heating plate 112. The micro TCEs may be used for fine tuning temperatures and/or other fields of micro zones of the heating plates. The macro zones may include the micro zones. One or more micro zones may overlap two or more of the macro zones. The macro zones and the micro zones may have predetermined, matching, different, or any arbitrary shape.

The heating plate 112 includes multiple temperature controlled zones (e.g., 4 zones, where each of the zones includes 4 temperature sensors). Each of the temperature controlled zones has corresponding macro and/or micro TCEs. The macros TCEs are controlled to roughly achieve selected temperatures in each of the respective temperature controlled zones. The micro TCEs may be individually controlled to finely adjust temperatures within the respective temperature controlled zones and/or to compensate for temperature non-uniformities in each temperature controlled zone. For example, for each set point temperature of a macro TCE, a temperature distribution response across a top surface of the heating plate 112 may be known and mapped (i.e., stored in memory). Similarly, a temperature distribution response of each of the micro TCEs across the surface of the heating plate 112 may be known and mapped. Although the systems and methods disclosed herein are described with respect to multi-zone heating plates and/or ESCs, the principles of the present disclosure may be applied to other temperature-controlled components of a substrate processing system.

The temperature controller 142 may control operation and thus temperatures of the TCEs 144 to control temperatures of the substrate support 106 and a substrate (e.g., the substrate 108) on the substrate support 106. The temperature controller 142 may communicate with a coolant assembly 146 to control coolant flow (pressures and flow rates) through the channels 116. For example, the coolant assembly 146 may include a coolant pump and reservoir. The temperature controller 142 operates the coolant assembly 146 to selectively flow the coolant through the channels 116 to cool the substrate support 106 and the heating plate 112. The temperature controller 142 may control the rate at which the coolant flows and a temperature of the coolant. The temperature controller 142 controls current supplied to the TCEs 144 and pressure and flow rates of coolant supplied to channels 116 based on detected parameters from sensors within the processing chamber 102.

A valve 156 and pump 158 may be used to evacuate reactants from the processing chamber 102. The system controller 160 may control components of the substrate processing system 100 including controlling supplied RF power levels, pressures and flow rates of supplied gases, RF matching, etc. The system controller 160 controls states of the valve 156 and the pump 158. A robot 170 may be used to deliver substrates onto, and remove substrates from, the substrate support 106. For example, the robot 170 may transfer substrates between the substrate support 106 and a load lock 172. The robot 170 may be controlled by the system controller 160. The system controller 160 may control operation of the load lock 172.

Figure 2:
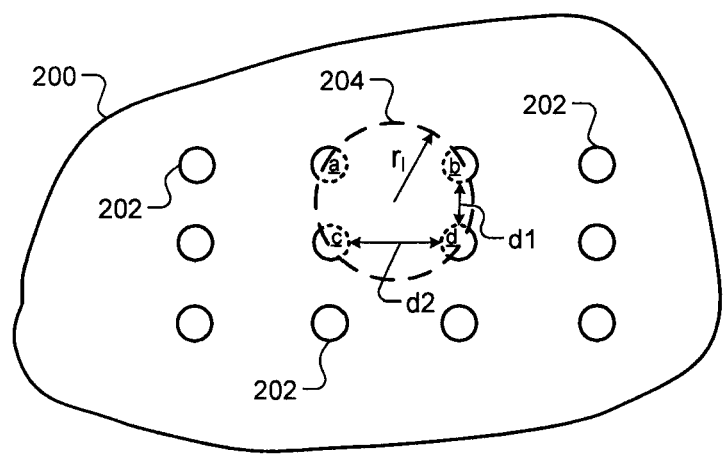
FIG. 2 is a top view of an example portion of a substrate support in accordance with an embodiment of the present disclosure.

FIG. 2 shows a top view of a portion 200 of a substrate support. The portion 200 may be included as part of the substrate support 106 of FIG. 1. The portion 200 includes mesas 202. Although the mesas 202 are shown having a same diameter, the diameters of the mesas 202 may be different and may be increasing from a center of the substrate support to an outer and/or outermost peripheral edge of the substrate support.

Areal density of mesas refers to a total contact area of the mesas in a local region of a substrate support. For example, areal density for a local region 204 of the substrate support shown in FIG. 2 is equal to a total contact area of the top surface areas of the mesas 202 that are within the local region 204 divided by an area of the local region. For example, the areal density for the local region 204 is equal to a sum of portions of the areas of the mesas 202 (labeled areas a-d in FIG. 2) within the local region 204 divided by the area of the local region 204

$$\left(\text{or } \frac{a+b+c+d}{\pi r_l^2}\right),$$

where $r_l$ is the radius of the local region 204. Portions of the areas a-d that are not in the identified local region 204 are not included in the sum.

Figure 3:
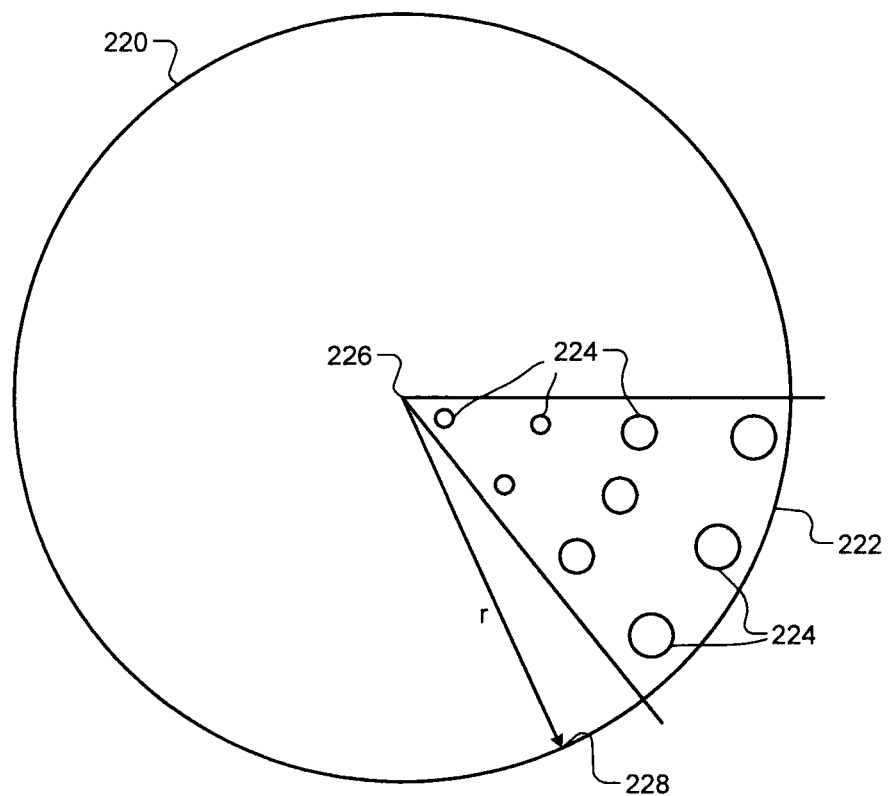
FIG. 3 is a top cut-away view of an example substrate and substrate support in accordance with an embodiment of the present disclosure.
Figure 10:
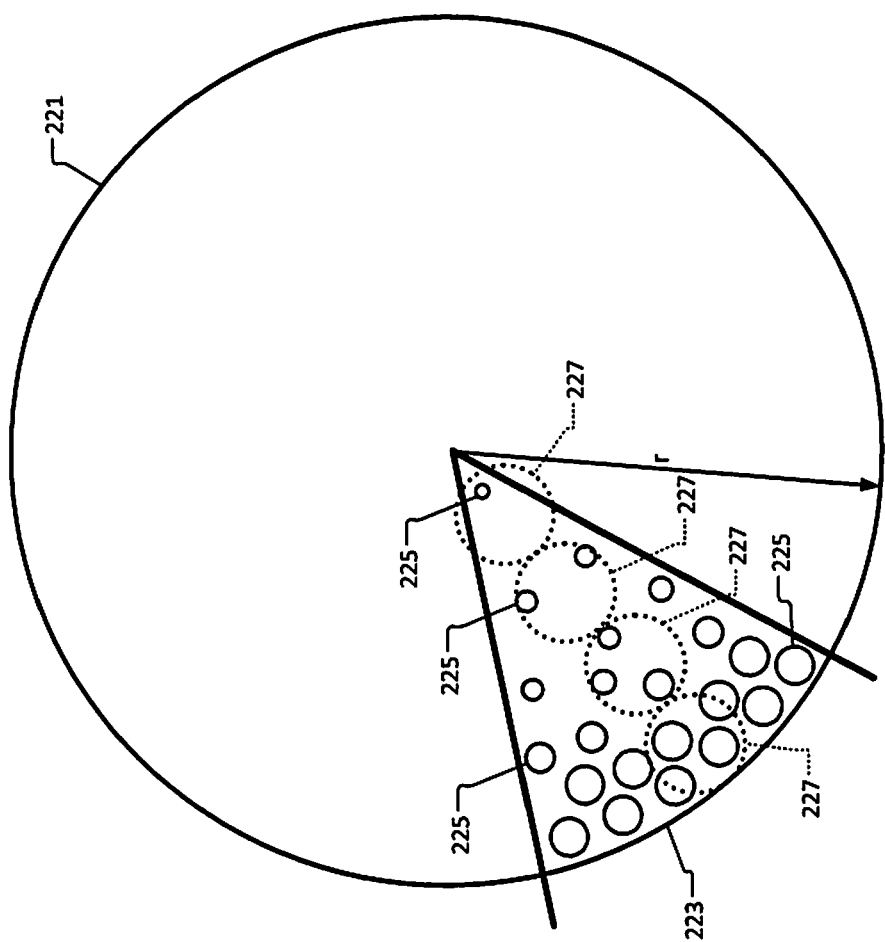
FIG. 10 is a top cut-away view of an example substrate and substrate support illustrating in accordance with an embodiment of the present disclosure.

In one embodiment, the areal density of a substrate support increases from a center of the substrate support to an outer and/or outermost peripheral edge of the substrate support. FIG. 3 shows a top cut-away view of an example substrate 220 on a substrate support 222. A portion of the substrate 220 is cut-away to illustrate a portion of mesas 224 of the substrate support 222. A radius r of the substrate 220 and substrate support 222 is shown. Areal density of the mesas 224 increases from a center 226 to a peripheral edge 228 and thus increase with radius of the substrate 220 and/or the substrate support 222. The areal density may increase monotonically and/or linearly as a radial distance from a center of the substrate support 222 increases. In one embodiment, substrate contact surface areas and/or diameters of the mesas 224 increase in size from a center 226 to the peripheral edge 228 and thus increase with radius of the substrate 220 and/or the substrate support 222. Alternatively or in addition to having the sizes of the contact surface areas of the mesas 224 increasing with radius, the number of mesas per unit top lateral surface area of the substrate 220 and/or per local region of the substrate support 222 may also increase with radius of the substrate 220 and/or the substrate support 222. See, for example FIG. 10, which shows an example substrate 221 on a substrate support 223. A portion of the substrate 221 is cut-away to illustrate a portion of mesas of the substrate support 223. Some of the mesas are identified with numerical designator 225. A radius r of the substrate 221 and substrate support 223 is shown. The number of the mesas of the substrate support 223 per unit top lateral surface area of the substrate 221 and/or the substrate support 223 linearly increases with radius of the substrate 221 and/or the substrate support 223. Example same sized top lateral surface areas 227 are shown. The sizes of the surface areas of the mesas increase along a radial distance from a center to an outermost edge of the substrate support.

In the example shown in FIG. 2, the local region 204 has the radius $r_l$. The radius $r_l$ may be selected such that a circumference of the local region passes through centers of the corresponding ones of the mesas 202. The radius $r_l$ is related to distances d1, d2 between the mesas. As the distances d1, d2 between the mesas 202 increase and/or as the radius n increases, localized vertical deflection of a substrate on the mesas 202 can increase due to pressures on a substrate. An example of vertical localized vertical deflection is shown in FIG. 5.

Figure 4:
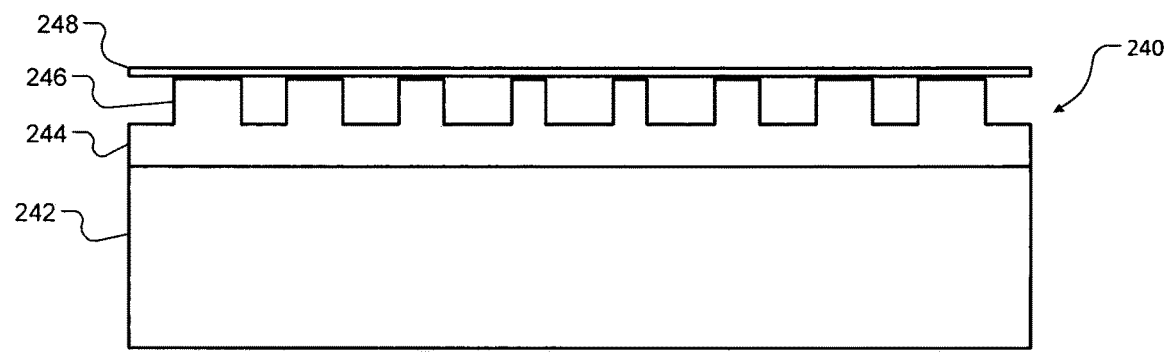
FIG. 4 is a side cross-sectional view of a substrate support incorporating mesas in accordance with an embodiment of the present disclosure.

FIG. 4 shows a substrate support 240 that includes a body 242 and may include a layer 244. The layer 244 may be an uppermost layer of the substrate support 240 and/or may be disposed on and/or an uppermost layer of the body 242. The body 242 may include an electrode, heating elements, coolant channels, etc. similarly to the substrate support 106 of FIG. 1. The layer 244 includes mesas 246. A substrate 248 is disposed on and is in contact with top contact surfaces of the mesas 246. The mesas 246 are configured to provide increasing areal density with increasing radius, as described above.

Figure 5:
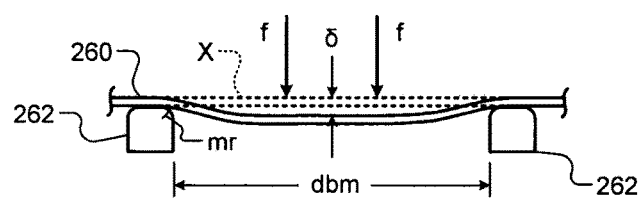
FIG. 5 is a side view illustrating vertical deflection of a substrate between adjacent mesas.

FIG. 5 is a side view illustrating vertical deflection δ of a substrate 260 between adjacent mesas 262. Due to force f exerted downward on the substrate 260 during processing, the substrate 260 can deflect between the mesas 262. An example of this deflection is identified as vertical deflection δ. The vertical deflection δ is based on distances between adjacent mesas and areal density. An example of distance between adjacent mesas 262 is identified as dbm in FIG. 5. An example radius mr of an upper edge of one of the mesas 262 is also shown.

Figure 6:
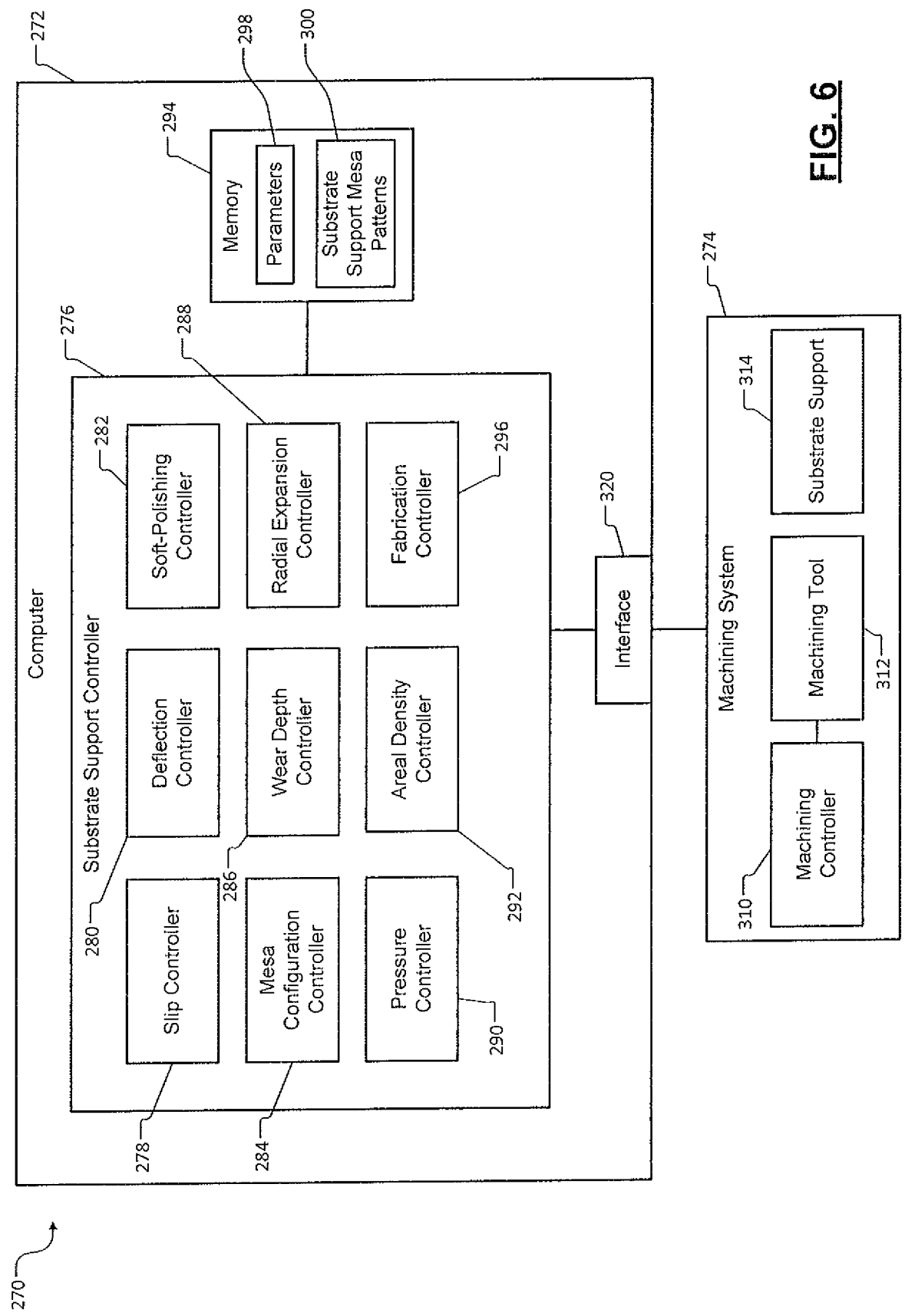
FIG. 6 is a substrate support system including a substrate support controller in accordance with an embodiment of the present disclosure.

FIG. 6 shows a substrate support system 270 that includes a computer 272 and a machining system 274. The computer 272 includes a substrate support controller 276 and a memory 294. The substrate support controller 276 may include a slip controller 278, a deflection controller 280, a soft-polishing controller 282, a mesa configuration controller 284, a wear depth controller 286, a radial expansion controller 288, a pressure controller 290, an areal density controller 292, and/or a fabrication controller 296. Operation of the controllers 278, 280, 282, 284, 286, 288, 290, 292, 296 is described below with respect to the method of FIG. 7.

The memory 294 stores parameters 298 and/or substrate support mesa patterns 300. The parameters 298 may include parameters detected by sensors of the processing system 100 of FIG. 1 and/or parameters used, estimated and/or determined during the method of FIG. 7. The substrate support mesa patterns may include: shapes and sizes of contact surface areas of mesas; numbers of mesas in each predetermined local region of substrate supports; heights of mesas; locations (or layout) of mesas across substrate supports; areal densities of the predetermined local regions; and/or areal density variation from centers to peripheral edges of the substrate supports.

The machining system 274 may include a computer numerical control (CNC) milling machine, a knurling machine, a molding machine, a casting machine, a three-dimensional (3D) printer, and/or other machines and/or devices suitable for fabricating a substrate support. The machining system 274 may include a machining controller 310 and a machining tool 312 used to fabricate a substrate support 314. The machining controller 310 may receive one of the substrate support mesa patterns from the computer 272 via an interface 320 and control operation of the machining tool 312 to fabricate the substrate support 314. The machining tool 312 may include a CNC milling tool and/or other suitable machining tool.

Figure 7:
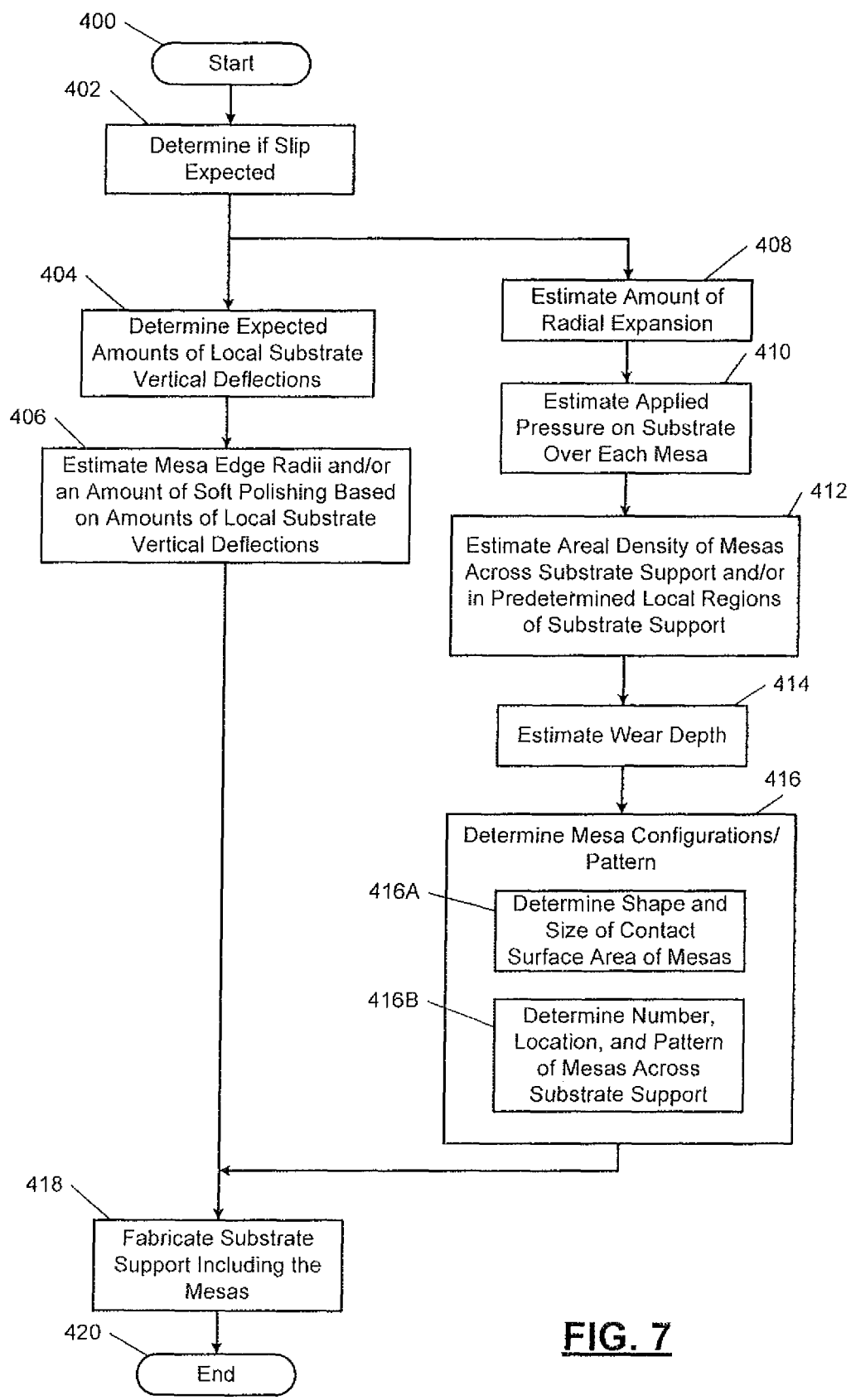
FIG. 7 illustrates an example substrate support fabrication method in accordance with an embodiment of the present disclosure.

For further defined structure of the controllers of FIGS. 1 and 6 see below provided method of FIG. 7 and below provided definition for the term "controller". The systems disclosed herein may be operated using numerous methods, an example method is illustrated in FIG. 7. In FIG. 7, a substrate support fabrication method is shown. Although the following tasks are primarily described with respect to the implementations of FIG. 6, the tasks may be easily modified to apply to other implementations of the present disclosure. The tasks may be iteratively performed.

The method may begin at 400. At 402, the slip controller 278 determines if slip of a substrate on a substrate support is expected. The slip controller 278 may perform parametric analysis to determine if slip is expected. Slip typically occurs under high heat and load conditions, which occur when forming through silicon vias (TSVs) in a substrate. Equation 1 provides a relationship between (i) force associated with thermal expansion of a substrate support and (ii) resistive force due to friction between a substrate and the substrate support. The left side of equation 1 is the force associated with thermal expansion and the right side of equation 1 is the resistive force, where: E is Young's modulus of a substrate; α is the coefficient of thermal expansion of the substrate; d is diameter of the substrate, h is thickness of the substrate; $Q_{in}$ is input heat transferred between the substrate and the substrate support due to ion bombardment on the substrate during processing; k is thermal conductivity of a back-side-gas (BSG) divided by the height of the mesa; $A_W$ is a contact surface area of a substrate; $T_{ref}$ is temperature of the substrate support; $T_0$ is starting temperature (or room temperature); μ is a coefficient of friction between the substrate and mesas of the substrate support; K is a constant that depends on dielectric properties of the mesas (e.g., dielectric properties of ceramic material of the mesas); V is a clamping voltage; $A_{MCA}$ is a sum of substrate contact surface areas of the mesas, $P_{BSG}$ a BSG pressure; and $A_W$ is a lateral surface area of the substrate support facing the substrate (e.g., $\pi r^2$, where r is radius of the substrate support). The input heat $Q_{in}$ is directly proportional to RF generated power and electrostatic clamping force. The more electrostatic clamping force the more heat transferred between the substrate and the substrate support. The greater the heights of the mesas, the less heat transfer between the substrate and the substrate support.

$$E\alpha(\pi d h)\left(\frac{Q_{in}}{kA_W} + T_{ref} - T_0\right) > \mu(KV^2 A_{MCA} - P_{BSG} A_W) \quad (1)$$

Using expected values for process conditions, equation 1 may show that the force associated with the thermal expansion of the substrate (left side of equation 1) is larger than the resistive force due to friction (right side of equation 1). For this reason, the substrate is expected to slip on the mesas.

If slip is to occur, the following tasks are performed to minimize particle generation due to mechanical wear of the substrate on the substrate support. The following tasks are directed to providing a distributed amount of substrate-to-mesa contact including minimizing the amount of substrate-to-mesa contact at a center of the substrate while providing a monotonically and/or linearly increasing amount of substrate-to-mesa contact with increased distance from the center. The increasing amount of substrate-to-mesa contact is provided with increased radius of the substrate support. This is due to the areal density of the mesas increasing proportionally to the radius of the substrate support. The increase in areal density may be provided by increasing contact surface areas of each of the mesas and/or increasing the number of mesas with radius of the substrate support. This minimizes damage to a backside of the substrate.

The following tasks 404, 406, 408, 410, 412, 414, 416 may be performed if slip is expected. If slip is not expected, one or more of the following tasks 404, 406, 408, 410, 412, 414, 416 may not be performed.

At 404, the deflection controller 280 estimates amounts of vertical deflection for predetermined regions (e.g., areas between two or more adjacent mesas). Referring to FIG. 2, areas between mesas 202 can be subject to vertical deflection during processing due to pressures on the corresponding substrate. The vertical deflection can be estimated using equations 2-3, which are associated with (i) a first principles analysis of mechanics of wear, and (ii) heat transfer effects that impact substrate expansion, where D' is substrate stiffness, E is Young's modulus of a substrate, h is thickness of the substrate, v is Poisson's ratio for a substrate material, ΔP is a clamping pressure, and $r_l$ is a radius of a local region. The radius $r_l$ may be referred to as a non-supported radius since a center portion of the local region is between mesas and is not supported by the mesas. The vertical deflection of the substrate is denoted by δ and may occur at a point between mesas (e.g., a center point of a local region, such as a center point of local region 204, which is a center point between the mesas that are at least partially in the local region).

$$D' = \frac{Eh^3}{(12(1-v^2))} \quad (2)$$

$$\delta = \frac{\Delta P r_l^4 (5+v)}{(64 D'(1+V))} \quad (3)$$

By properly selecting the radius $r_l$ and/or positioning of the mesas relative to each other, vertical deflection can be minimized. The smaller the distances between the mesas, the smaller the vertical deflection. The radius $r_l$ and locations of the mesas may be determined at 414, as described below. The vertical deflection $\delta$ is sensitive to the radius $r_l$. A small change in the radius $r_l$ causes a large change in the vertical deflection $\delta$.

At 406, the soft-polishing controller 282 estimates mesa edge radii (e.g., radius mr) and/or an amount of soft-polishing based on the amounts of substrate vertical deflections in the local regions of the substrate support. The phrase "soft-polishing" refers to the rounding of upper peripheral edges of mesas. Radii of the mesas and/or amounts of soft-polishing may be determined for polishing the upper peripheral edges to have the radii. The larger the radii, the more vertical deflection may occur. However, the larger the radii, the less localized stress at the edges of the mesas. Based on the determined vertical deflections, amounts of deflection at edges of the mesas may be determined. The radii and/or the amounts of soft-polishing may be determined based on the amounts of deflection at the edges of the mesas. The larger the vertical deflection, the more the radius $r_l$ may be reduced.

At 408, the radial expansion controller 288 estimates an amount of radial expansion L of the substrate. The amount of radial expansion L is equal to the lateral sliding distance of a portion of the substrate relative to the substrate support when the substrate is heated uniformly. The amount of radial expansion L may be measured from a center of the substrate to the point of expansion and movement. The amount of radial expansion L increases with radius of the substrate. The center of the substrate does not move. Points away from the center move outward from the center during thermal expansion of the substrate. The amount of radial expansion L is linearly related to the wear depth D and may be estimated using equation 4, where $\alpha$ is the coefficient of thermal expansion of the substrate, r is distance from a center of the substrate to the point of expansion, and $\Delta T$ is a change in a temperature of the substrate.

$$L = \alpha r \Delta T \quad (4)$$

The change in temperature $\Delta T$ is equal to $$\frac{Q_{in}}{kA_W} + T_{ref} - T_0,$$

which is part of the left side of equation 1. Equation 4 is based on an assumption that the substrate support does not expand during processing. If the substrate support does expand, then the coefficient of thermal expansion a is replaced in equation 4 with a difference between (i) the coefficient of thermal expansion of the substrate and (ii) a coefficient of thermal expansion of the substrate support. This provides similar results in determining areal density at 414.

Figure 8:
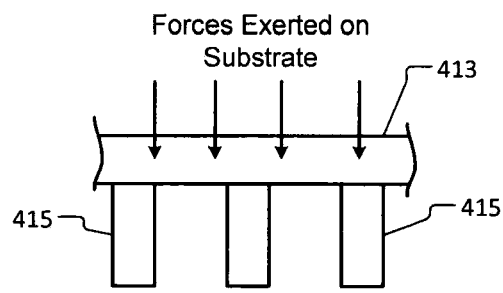
FIG. 8 is a side view of an example of a portion of a substrate and a substrate support illustrating clamping pressure exerted on the substrate.
Figure 9:
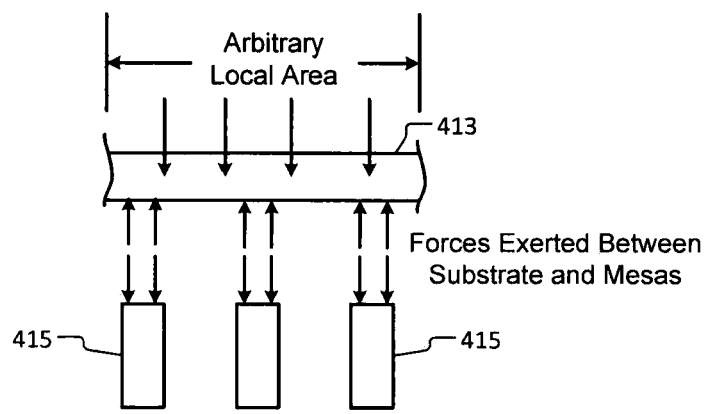
FIG. 9 is a side view of an example of a portion of a substrate and a substrate support illustrating forces exerted in a local area.

At 410, the pressure controller 290 estimates pressure p on the substrate at a contact point (referred to as a "mesa/substrate interface"). Referring now to FIGS. 8 and 9, which show forces exerted on a portion 413 of a substrate and forces exerted between the portion 413 and mesas 415. Based on equation 5 and since wear of the substrate is of interest, the pressure p at the mesa/substrate interface is estimated and used in following task 412. Equation 5 may be used to determine the pressure p, where $p_o$ is average clamping pressure, which is directly related to an average substrate clamping force per unit area.

$$p = \frac{\left(\frac{F}{A_W}\right) A_o}{A_{MCA}} = \frac{p_o}{\gamma} \quad (5)$$

At 412, the areal density controller 292 determines areal densities of the mesas across the substrate support and/or in predetermined local regions of the substrate support. The mesas may be scaled and configured, such that areal densities of the mesas increase monotonically and/or linearly with radius of the substrate support. The areal density controller 292 may estimate the areal density $\gamma$ for one or more local regions. Equation 7 may be used to estimate the areal density $\gamma$, where $A_{MCA}$ is the total mesa contact surface area within the corresponding local region, and $A_o$ is the total lateral local surface area of the corresponding local region.

$$\gamma = \frac{A_{MCA}}{A_o} \quad (6)$$

At 414, the wear depth controller 286 estimates one or more wear depths of the substrate on the substrate support. The wear depth may be estimated based on the amount of radial expansion L, the pressure p, and the areal densities determined at 412. Wear can occur due to the substrate heating up during processing, which causes the substrate to expand. Due to the thermal expansion of the substrate, rubbing between a backside of the substrate and the mesas occurs. A traditional substrate support can cause increased wear near outer peripheral edges of a substrate as compared to a center of a substrate. This is due to increased expansion with substrate radius. Pressure force from clamping is not sufficient to prevent the thermal expansion.

A wear depth D may be estimated using equations 7-8 for one or more mesas, where k is a probability of forming a particle (may be assumed constant over contact surface area), S is strength of the substrate material being worn away, F is force on the contact surface, $A_a$ is an area of a substrate contact surface(s) of the one of the one or more mesas, L is sliding distance of a portion of the substrate at a location corresponding to the one of the mesas, k' is $$\frac{k}{S},$$

and p is average pressure on the substrate contact surface(s) of the one or more mesas and is equal to $$\frac{F}{A_a}.$$

$$D = \left(\frac{k}{S}\right)\left(\frac{F}{A_a}\right) L = k' p L \quad (7)$$

Equation 8 is provided by substituting expressions for the amount of radial expansion L and the pressure p from equations 4-5 into equation 7.

$$D = k'\left(\frac{p_o}{\gamma}\right)\alpha r \Delta T \qquad (8)$$

To provide a uniform wear pattern across the backside of the substrate, the only parameters of equation 8 that should be functions of geometry are r and γ. Thus, in order for the wear depth D to be constant independent of r, the areal density γ is set to be directly proportional to the radius r (or γ∝r).

As a result, the areal density is increased as a percentage proportional to r (or the distance from a center of the substrate support). This results in pressure over the mesas that decrease with increase in r. This compensates for the increases in sliding distance L with increase in r. The increase in areal density results in uniform wear across the surface of the substrate. Depending on the wear depth, tasks 408, 410, 412, 414 may be repeated to reduce the estimated wear depth. One or more parameters, such as areal densities, mesa heights, sizes of contact surface areas, etc., may be adjusted prior to each iteration.

At 416, the mesa configuration controller 284 determines mesa configurations and/or a mesa pattern for the mesas of the substrate support. At 416A, the mesa configuration controller 284 determines shapes and sizes of contact surface areas of the mesas based on the one or more determined areal densities. The mesas may be cylindrically-shaped, hemi-spherically-shaped, semi-spherically-shaped and/or may have other shapes. The mesas may be uniformly shaped or may have different shapes. The contact surface areas of the mesas may increase, such that mesas further way-away from a center of the substrate have larger contact surface areas than mesas closer to the center of the substrate. In addition or alternatively, the number of mesas may increase with increase in radius of the substrate support.

Task 416B, may include the mesa configuration controller 284 determining heights of the mesas. The less electrostatic clamping force the less heat transferred between the substrate and the substrate support. The greater the heights of the mesas, the less pressure on the substrate and the less heat transfer between the substrate and the substrate support. By adjusting and/or maximizing heights of the mesas, the less electrostatic clamping force and the less substrate wear. The areal densities may be set to allow the heights of the mesas to be uniform. By accounting for the mechanics of electrostatic clamping and the mechanics of differential BSG pressure, the disclosed method further minimizes substrate wear.

At 414B, the mesa configuration controller 284 determines number, location and pattern of the mesas across the substrate support. Different patterns of increasing areal density may be implemented depending on the amount of substrate expansion due to different process RF power levels and conditions. Each of these patterns includes monotonically and/or linearly increasing areal density with substrate support radius to provide minimal and uniform wear across the substrate including minimizing contact pressure between the substrate and the substrate support and stress concentrations at upper peripheral edges of the mesas.

Sizes and shapes of areas between mesas and/or the radii of the local regions of the substrate support may be minimized and/or set to minimize vertical deflections of the substrate in the areas and/or local regions. The sizes and shapes of the areas between mesas and/or the radii of the local regions of the substrate support may be set based on or in a manner to be compatible with determined radii of the outer peripheral edges of the mesas. The determined radii of the outer peripheral edges of the mesas may be determined at 406 based on the sizes and shapes of the areas between mesas and/or the radii of the local regions of the substrate support.

Tasks 402, 404, 406, 408, 410, 412, 414 and/or 416 may be iteratively performed prior to performing tasks 418 to minimize vertical deflections, wear depth, localized stress at outer peripheral edges of mesas, and provide uniform wear across the backside of a substrate while also minimizing contact between the substrate and the substrate support. The parameters determined during tasks 402, 404, 406, 408, 410, 412, 414, and 416 are related and thus altering one of the parameters can affect values of the other parameters. Iterative performance of these tasks allows the parameters to be adjusted until further changes in these parameters negligibly change estimated values of vertical deflection, wear depth, localized stress, etc. The parameters may be iteratively adjusted until changes in values of vertical deflection, wear depth, localized stress, etc. are within predetermined ranges.

At 418, the fabrication controller 296 sends parameters for the substrate support, as determined during tasks 402, 404, 406, 408, 410, 412, 414, 416, to the machining system 274. The machining controller 310 controls operation of the machining tool 312 to form the substrate support and/or a layer (e.g., an upper most layer) of the substrate support. The layer is formed to have mesas in a mesa pattern as determined at 416. The fabrication may include performing soft-polishing. The rounding of the outer peripheral edges of the mesas reduces stress concentrations at the edges and reduces surfaces roughness of the substrate support to reduce solid-to-solid lateral contact when slippage between the substrate and the substrate support occurs. The method may end at 420.

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

The above-described method results in minimal and uniform substrate backside wear. This holds true for high-power processes, such as processes during which 30-70 kilowatts of RF power are provided to electrodes of substrate processing system. The method does not include increasing contact surface area between mesas near a center of a substrate and a substrate support, but rather includes increasing areal density with radius (or distance from a center) of the substrate support.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:
1. A substrate support for a substrate processing system, the substrate support comprising:
  a body comprising a plurality of local regions; and
  a plurality of mesas distributed across the body and configured to support a substrate,
  wherein
    each of the plurality of mesas includes a surface area that contacts and supports the substrate,
    the plurality of local regions are same sized and circular shaped,
    a circumference of each of the plurality of local regions passes through a center of each of the plurality of mesas having a contact surface area portion in a corresponding one of the plurality of local regions, areal densities of the plurality of mesas linearly increase along a radial distance from a center of the substrate support to an outermost edge of the substrate support, the areal densities are each defined as a sum of contact surface area portions of the plurality of mesas within the corresponding local region divided by an area of the corresponding local region.

2. The substrate support of claim 1, wherein:
each of the surface areas of the plurality of mesas has a circular shape; and
diameters of the plurality of mesas monotonically increase with increase in the radial distance.

3. The substrate support of claim 1, wherein each of the plurality of mesas has a same height.

4. The substrate support of claim 1, wherein:
the plurality of mesas are configured to provide uniform wear on a backside of the substrate; and
the backside of the substrate faces the surface areas of the plurality of mesas.

5. The substrate support of claim 1, wherein each of the plurality of mesas has a cylindrical shape or a semi-spherical shape.

6. The substrate support of claim 1, wherein at least one of (i) distances between adjacent ones of the plurality of mesas decrease with increase in the radial distance, or (ii) sizes of contact surfaces of the plurality of mesas increase with increase in the radial distance.

7. The substrate support of claim 1, comprising an electrostatic chuck comprising the body.

8. The substrate support of claim 1, wherein at least one of (i) contact surface areas of the plurality of mesas, or (ii) number of mesas per a predetermined area of the substrate support, linearly increases with increase in the radial distance from the center to the outermost edge of the substrate support.

9. The substrate support of claim 1, wherein each of the plurality of mesas, which is disposed radially outward of an adjacent one of the plurality of mesas, has a larger contact surface area than the adjacent one of the plurality of mesas.

10. The substrate support of claim 1, wherein each of the plurality of mesas, which is disposed along a radius of the substrate support and radially outward of an adjacent one of the plurality of mesas, has a larger contact surface area than the adjacent one of the plurality of mesas.

11. The substrate support of claim 1, wherein edge radii of the plurality of mesas are related to estimated amounts of local substrate vertical deflection.

12. The substrate support of claim 1, wherein each of the plurality of local regions includes four of the contact surface area portions.

13. A substrate processing system comprising:
the substrate support of claim 1;
a radio frequency (RF) power generator configured to generate RF power and supply the RF power to the substrate support; and
a system controller controlling operation of the RF generator.

14. A substrate support for a substrate processing system, the substrate support comprising:
a body comprising a plurality of equally sized surface area portions; and
a plurality of mesas distributed across the body and configured to support a substrate,
wherein
each of the plurality of mesas includes a surface area that contacts and supports the substrate,
a number of mesas per each of the equally sized surface area portions of the body increases along a radial distance from a center of the substrate support to an outermost edge of the substrate support, and
sizes of the surface areas of the plurality of mesas increase along the radial distance from the center to the outermost edge of the substrate support.

15. The substrate support of claim 14, wherein the number of mesas per the equally sized surface area portions of the body linearly increases with increase in the radial distance from the center to the outermost edge of the substrate support.

16. The substrate support of claim 14, wherein lengths of edge radii of the plurality of mesas are related to sizes and shapes of areas between the mesas.

17. The substrate support of claim 16, wherein the edge radii of the plurality of mesas are related to estimated amounts of local substrate vertical deflection.

* * * * *